(12) United States Patent
Ko et al.

(10) Patent No.: US 7,767,474 B2
(45) Date of Patent: Aug. 3, 2010

(54) DRIVE FILM, DRIVE PACKAGE FOR ORGANIC LIGHT EMITTING DIODE DISPLAY, ORGANIC LIGHT EMITTING DIODE DISPLAY INCLUDING THE SAME AND METHOD THEREOF

(75) Inventors: Chun-Seok Ko, Hwaseong-si (KR); Nam-Deog Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 1079 days.

(21) Appl. No.: 11/471,341

(22) Filed: Jun. 20, 2006

(65) Prior Publication Data
US 2006/0238666 A1 Oct. 26, 2006

(30) Foreign Application Priority Data
Aug. 4, 2005 (KR) .................... 10-2005-0071347

(51) Int. Cl.
*H01L 21/00* (2006.01)
(52) U.S. Cl. .................... 438/26; 257/72; 345/80; 345/82; 349/151
(58) Field of Classification Search ............ 438/25, 438/26; 257/72, 59; 345/80, 82, 90; 349/149–151; 315/169.1, 169.3; 313/498, 504, 506
See application file for complete search history.

(56) References Cited

U.S. PATENT DOCUMENTS

| | | | | |
|---|---|---|---|---|
| 5,739,887 A | * | 4/1998 | Ueda et al. | 349/149 |
| 6,765,549 B1 | * | 7/2004 | Yamazaki et al. | 345/80 |
| 6,882,396 B2 | * | 4/2005 | Ko et al. | 349/149 |
| 7,417,373 B2 | * | 8/2008 | Yamazaki | 313/506 |
| 2005/0088391 A1 | | 4/2005 | Kim | 345/94 |
| 2007/0216299 A1 | * | 9/2007 | Park et al. | 313/512 |

FOREIGN PATENT DOCUMENTS

| | | |
|---|---|---|
| JP | 2000-235376 | 8/2000 |
| JP | 2004-64047 | 2/2004 |
| JP | 2004-127924 | 4/2004 |
| KR | 1999-009397 | 2/1999 |
| KR | 2001-0103390 | 11/2001 |
| KR | 10-2004-0050524 | 6/2004 |
| KR | 10-2004-0058698 | 7/2004 |
| KR | 10-2004-0078245 | 9/2004 |
| KR | 10-2005-0001064 | 1/2005 |
| KR | 10-2005-0011873 | 1/2005 |
| KR | 10-2005-0031628 | 4/2005 |
| KR | 10-2005-0038119 | 4/2005 |
| KR | 10-2005-0040618 | 5/2005 |

\* cited by examiner

*Primary Examiner*—Haissa Philogene
(74) *Attorney, Agent, or Firm*—Cantor Colburn LLP (57) ABSTRACT

A drive film, a drive package for an organic light emitting diode display, an organic light emitting diode display including the same, and a method thereof are provided wherein the drive film includes a base film having an input terminal and an output terminal, a plurality of first signal lines formed on the base film, and a plurality of second signal lines formed on the base film and disposed between the first signal lines at the output terminal.

31 Claims, 9 Drawing Sheets

DRIVE FILM, DRIVE PACKAGE FOR ORGANIC LIGHT EMITTING DIODE DISPLAY, ORGANIC LIGHT EMITTING DIODE DISPLAY INCLUDING THE SAME AND METHOD THEREOF

This application claims priority to Korean Patent Application No. 10-2005-0071347, filed on Aug. 4, 2005 and all the benefits accruing therefrom under 35 U.S.C. §119, and the contents of which in its entirety are herein incorporated by reference.

BACKGROUND OF THE INVENTION (a) Field of the Invention

The present invention relates to a drive film, a drive package for an organic light emitting diode ("OLED") display, an OLED display including the same, and a method thereof. More particularly, the present invention relates to a drive film enhancing uniformity of a display, a drive package for an OLED display, an OLED display including the same, and a method of enhancing uniformity of the display.

(b) Description of the Related Art

Recent trends of light-weight and thin personal computers and televisions sets require light-weight and thin display devices, and flat panel displays satisfying such a requirement are being substituted for conventional cathode ray tubes ("CRT").

Flat panel displays include a liquid crystal display ("LCD"), a field emission display ("FED"), an organic light emitting diode ("OLED") display, a plasma display panel ("PDP"), and so on.

Generally, an active matrix flat panel display includes a plurality of pixels arranged in a matrix, and it displays images by controlling the luminance of the pixels based on given luminance information. An OLED display is a self-emissive display device, and thus does not require an exterior light source. The OLED display displays images by electrically exciting a light emitting organic material, and it has low power consumption, a wide viewing angle, and a fast response time, thereby being advantageous for displaying motion images.

A pixel of an OLED display includes an OLED and a thin film transistor ("TFT") for driving the same.

BRIEF SUMMARY OF THE INVENTION

The present invention provides a drive film, a drive package for an organic light emitting diode display, an organic light emitting diode display including the same, and a method thereof having advantages of enhanced uniformity of display while supplying much more current for effectively using limited areas.

Exemplary embodiments of the present invention provide a drive film for an organic light emitting diode display including a base film having an input terminal and an output terminal, a plurality of first signal lines formed on the base film, and a plurality of second signal lines formed on the base film and disposed between the first signal lines at the output terminal.

The second signal lines may be alternatingly disposed between the first signal lines, respectively, at the output terminal, such that the second signal lines are evenly distributed across the output terminal. A first set of the second signal lines at the input terminal may be electrically connected to a second set of the second signal lines at the output terminal via a conductive layer disposed over the base film and the first and second signal lines.

The drive film may further include an insulating film formed on the first signal lines and the second signal lines and exposing portions of the first and second signal lines at the input terminal and the output terminal of the base film, a conductive layer formed on the insulating film, and a plurality of connecting members connecting the second signal lines and the conductive layer near the input terminal and the output terminal.

The connecting members may include penetrating holes passing through the insulating film, and each connecting member may include a conductive portion.

The base film may include polyimide.

The first signal lines may transmit signals that have varying values.

The second signal lines may transmit signals that have fixed values.

Other exemplary embodiments of the present invention provide a drive package for an organic light emitting diode display including a base film having an input terminal and an output terminal, a conductive layer formed on the base film and exposing portions of the input terminal and the output terminal of the base film, a drive circuit chip mounted on the base film and exposed over the conductive layer, a plurality of first signal lines formed on the base film and connected to the drive circuit chip, a plurality of second signal lines formed near the input terminal and a plurality of second signal lines formed near the output terminal of the base film, the plurality of second signal lines formed near the output terminal disposed between the first signal lines at the output terminal, an insulating film interposed between the first and second signal lines and the conductive layer, and a plurality of connecting members connecting the second signal lines and the conductive layer near the input terminal and the output terminal.

Here, the connecting members may include penetrating holes passing through the insulating film. The base film may include polyimide. The first signal lines may transmit data voltages, and they may transmit scanning voltages. The second signal lines may transmit a drive voltage, and they may transmit a common voltage. The drive circuit chip may include a data drive integrated circuit chip, and it may include a scanning drive integrated circuit chip. The second signal lines may be evenly distributed across the output terminal.

Other exemplary embodiments of the present invention provide an organic light emitting diode display including a substrate, a display region formed on the substrate, and a first drive package successively attached to at least one of the upper and lower edges of the substrate. The first drive package includes a first base film including an input terminal and an output terminal, a first conductive layer formed on the first base film and exposing portions of the input terminal and the output terminal of the first base film, a first drive circuit chip mounted on the first base film and exposed over the first conductive layer, a plurality of first signal lines formed on the first base film and connected to the first drive circuit chip, a plurality of second signal lines formed near the input terminal and a plurality of second signal lines formed near the output terminal of the first base film, the plurality of second signal lines formed near the output terminal disposed between the first signal lines at the output terminal, a first insulating film interposed between the first and second signal lines and the first conductive layer, and a plurality of first connecting members connecting the second signal lines and the first conductive layer near the input terminal and the output terminal.

The first signal lines may transmit data voltages, and the first drive circuit chip may include a data drive integrated circuit chip. The second signal lines may transmit a common voltage or a drive voltage.

The organic light emitting diode display may further contain a second drive package attached to at least one of the left and right edges of the substrate, wherein the second drive package includes a second base film having an input terminal and an output terminal, a second conductive layer formed on the second base film and exposing portions of the input terminal and the output terminal of the second base film, a second drive circuit chip mounted on the second base film and exposed over the second conductive layer, a plurality of third signal lines formed on the second base film and connected to the second drive circuit chip, a plurality of fourth signal lines formed near the input terminal and a plurality of fourth signal lines formed near the output terminal of the second base film, and the plurality of fourth signal lines formed near the output terminal disposed between the third signal lines at the output terminal, a second insulating film interposed between the third and fourth signal lines and the second conductive layer, and a plurality of second connecting members connecting the fourth signal lines and the second conductive layer near the input terminal and the output terminal.

The fourth signal lines may transmit a common voltage or a drive voltage. The third signal lines may transmit scanning voltages, and the second drive circuit chip may include a scanning drive integrated circuit chip.

Other exemplary embodiments of the present invention provide a method of enhancing uniformity of a display of an organic light emitting diode display, the method including providing a drive package having an input terminal on a first edge, an output terminal on a second edge opposite the first edge, and having third and fourth opposing edges connected between the first and second edges, attaching the output terminal of the drive package to a display panel of the organic light emitting diode display, and substantially evenly delivering a fixed voltage from the output terminal of the drive package along a length of the output terminal extending from the third edge to the fourth edge of the drive package.

Providing a drive package may include arranging a plurality of first signal lines on a base film of the drive package, arranging a first set of second signal lines adjacent the input terminal, and a second set of second signal lines adjacent the output terminal, and uniformly distributing the second set of signal lines from the third edge to the fourth edge of the drive package, wherein the fixed voltage is delivered from the second set of signal lines to the display panel.

Arranging the plurality of first signal lines may include alternatingly arranging the first signal lines with the second set of second signal lines adjacent the output terminal.

The method may further include substantially evenly delivering a variable voltage from the output terminal of the drive package along a length of the output terminal extending from the third edge to the fourth edge of the drive package.

Substantially evenly delivering the fixed voltage and the variable voltage from the output terminal may include alternatingly arranging signal lines delivering the fixed voltage with signal lines delivering the variable voltage.

BRIEF DESCRIPTION OF THE DRAWINGS

The above and other features and advantages of the present invention will become more apparent by describing exemplary embodiments thereof with reference to the accompanying drawings, in which.

DETAILED DESCRIPTION OF THE INVENTION

With reference to the accompanying drawings, the present invention will be described in order for those skilled in the art to be able to implement the invention. As those skilled in the art would realize, the described embodiments may be modified in various different ways, all without departing from the spirit or scope of the present invention.

To clarify multiple layers and regions, the thicknesses of the layers are enlarged in the drawings. Like reference numerals designate like elements throughout the specification. When it is said that any part, such as a layer, film, area, or plate is positioned on another part, it means the part is directly on the other part or above the other part with at least one intermediate part. On the other hand, if any part is said to be positioned directly on another part, it means that there is no intermediate part between the two parts. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In general, the larger an OLED display becomes, the more current is needed to display the same luminance, so current intensity that can be supplied is an important factor in determining uniformity of a display. However, supplying a large amount of current using an edge area of a limited width is not easy with a large display panel, and it is also difficult to supply currents uniformly to the entire display panel.

Thus, as will be described below with reference to the exemplary embodiments, the present invention supplies much more current to effectively use limited areas and enhance uniformity of display.

Now, exemplary drive films, exemplary drive packages, exemplary display devices, and exemplary driving methods thereof according to exemplary embodiments of the present invention will be described with reference to the accompanying drawings.

Figure 1:
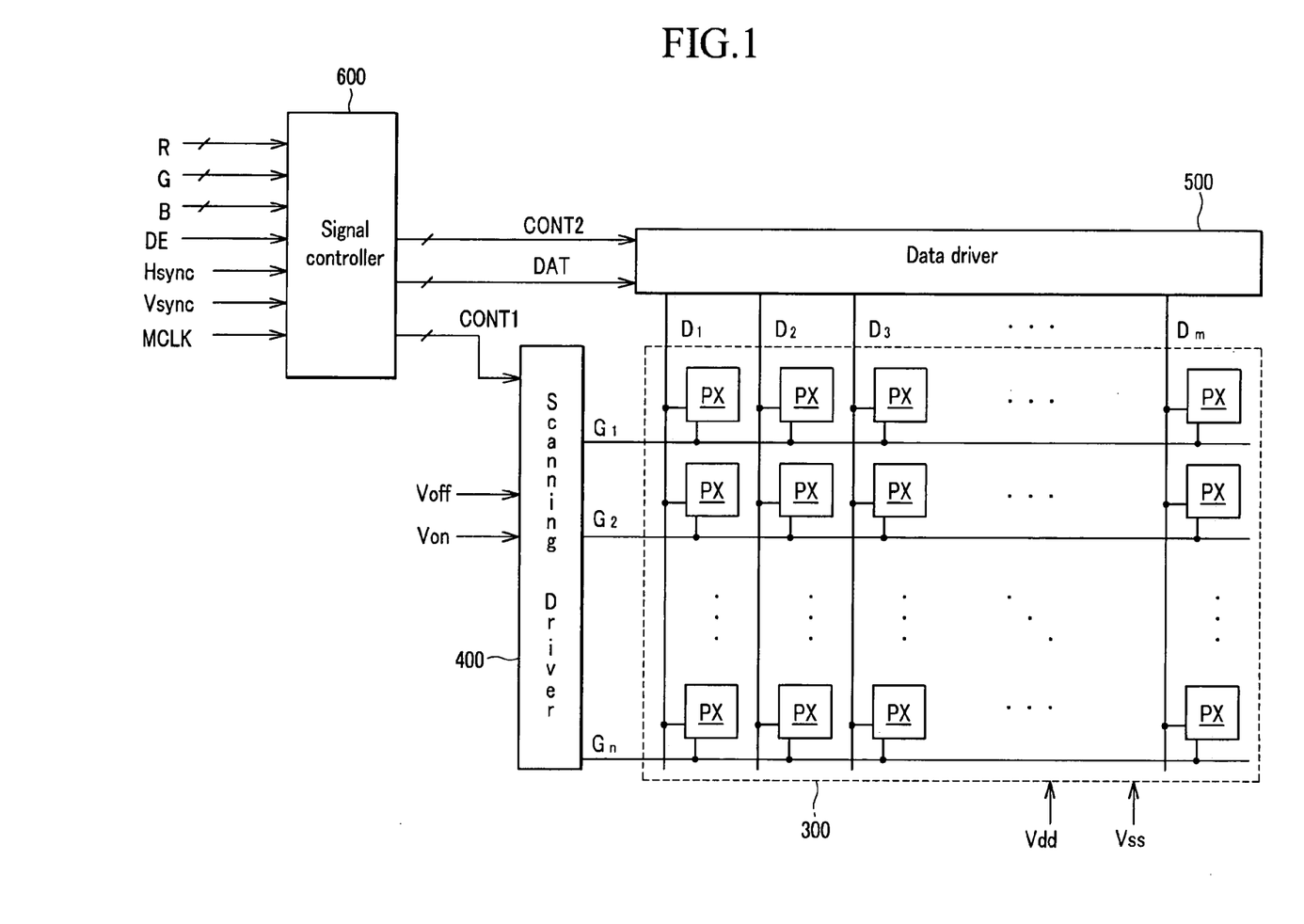
FIG. 1 is a block diagram of an exemplary OLED display according to an exemplary embodiment of the present invention.
Figure 2:
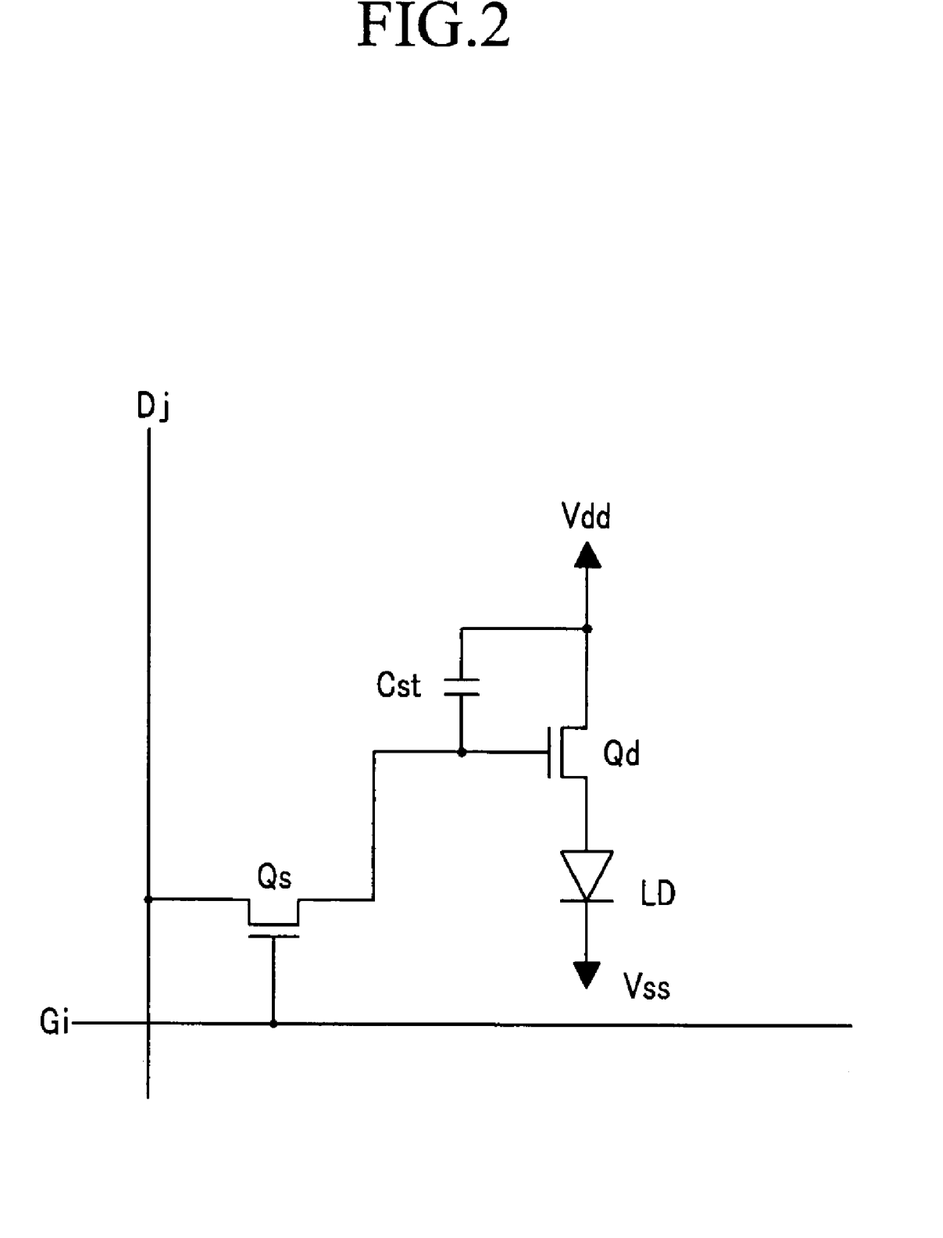
FIG. 2 is an equivalent circuit diagram of an exemplary pixel of an exemplary OLED display according to an exemplary embodiment of the present invention.

FIG. 1 is a block diagram of an exemplary OLED display according to an exemplary embodiment of the present invention, and FIG. 2 is an equivalent circuit diagram of an exemplary pixel of an exemplary OLED display according to an exemplary embodiment of the present invention.

As shown in FIG. 1, an OLED display includes a display panel 300, a scanning driver 400 and a data driver 500 that are connected to the display panel 300, and a signal controller 600 for controlling the scanning driver 400 and the data driver 500.

The display panel 300 includes a plurality of display signal lines $G_1$-$G_n$ and $D_1$-$D_m$, a plurality of drive voltage lines (not shown), and a plurality of pixels PX connected to the above elements and arranged substantially in a matrix, as illustrated.

The display signal lines $G_1$-$G_n$ and $D_1$-$D_m$ include a plurality of scanning lines $G_1$-$G_n$, also known as gate lines, for transmitting scanning signals, also known as gate signals, and a plurality of data lines $D_1$-$D_m$, also known as source lines, for transmitting data voltages, also known as source signals. The scanning lines $G_1$-$G_n$ extend substantially in a row direction, a first direction, and are separated from and substantially parallel to each other. The data lines $D_1$-$D_m$ extend substantially in a column direction, a second direction, and are separated from and substantially parallel to each other.

A drive voltage Vdd is transmitted to each of the pixels PX.

As shown in FIG. 2, each pixel PX, for example, the pixel connected to the scanning line $G_i$ and the data line $D_j$, includes an OLED LD, a driving transistor Qd, a capacitor Cst, and a switching transistor Qs.

The driving transistor Qd is a three-terminal element and has a control terminal, such as a gate electrode, connected to the switching transistor Qs and the capacitor Cst, an input terminal, such as a source electrode, connected to a drive voltage Vdd, and an output terminal, such as a drain electrode, connected to the OLED LD.

The switching transistor Qs is also a three-terminal element and has a control terminal, such as a gate electrode, connected to the scanning line $G_i$, an input terminal, such as a source electrode, connected to the data line $D_j$, and an output terminal, such as a drain electrode, connected to the capacitor Cst and the driving transistor Qd.

The capacitor Cst is connected between the switching transistor Qs and a drive voltage Vdd, such as between the output terminal of the switching transistor Qs and the drive voltage Vdd. The capacitor Cst is also connected between the control terminal of the driving transistor Qd and the drive voltage Vdd. The capacitor Cst stores and preserves the data voltage applied from the switching transistor Qs for a predetermined time.

The OLED LD has an anode connected to the driving transistor Qd and a cathode connected to the common voltage Vss. The OLED LD displays images by emitting light having intensity depending on the current $I_{LD}$ supplied from the output terminal of the driving transistor Qd. The current $I_{LD}$ supplied from the driving transistor Qd depends on the voltage Vgs between the control terminal and the output terminal of the driving transistor Qd.

The switching transistor Qs and the driving transistor Qd are n-channel field effect transistors ("FETs") including amorphous silicon ("a-Si") or polysilicon. However, the transistors Qs and Qd may be p-channel FETs, and in this case, since the p-channel FETs and the n-channel FETs are complementary to each other, the operations, voltages, and currents of the p-channel FETs are opposite to those of the n-channel FETs.

Now, a structure of an OLED LD and a driving transistor Qd of the OLED display illustrated in FIG. 2 will be further described with reference to FIG. 3 and FIG. 4.

Figure 3:
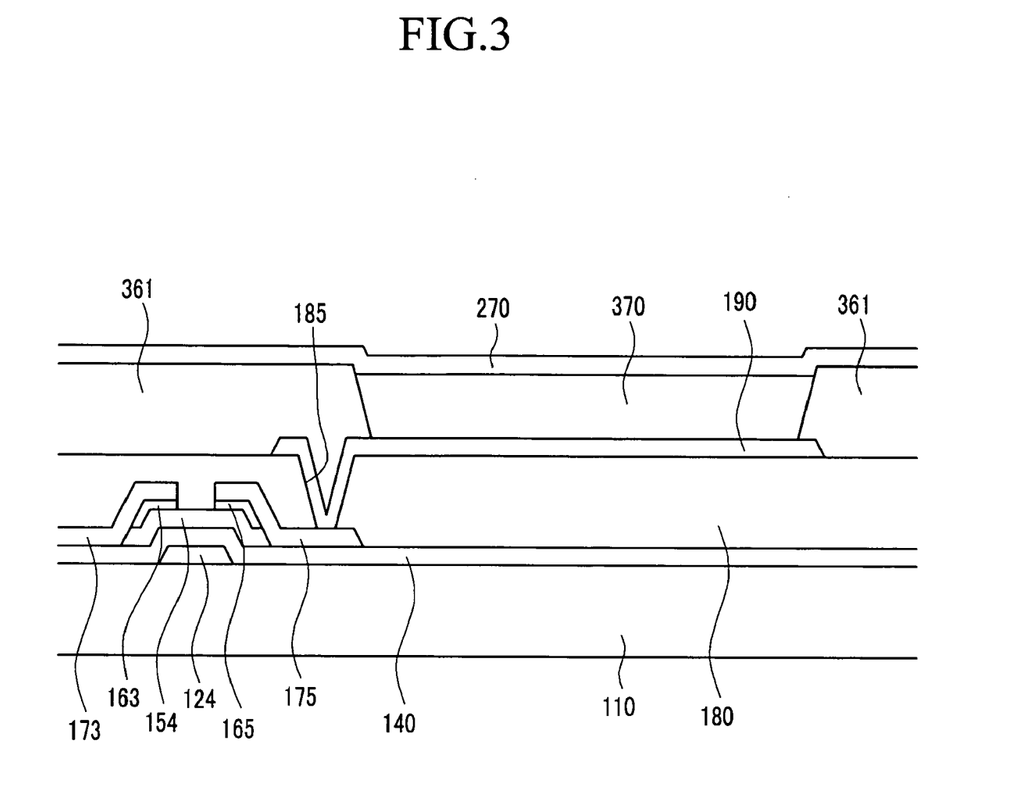
FIG. 3 is an exemplary sectional view of an exemplary OLED and an exemplary driving transistor of an exemplary pixel of an exemplary OLED display shown in FIG. 2.
Figure 4:
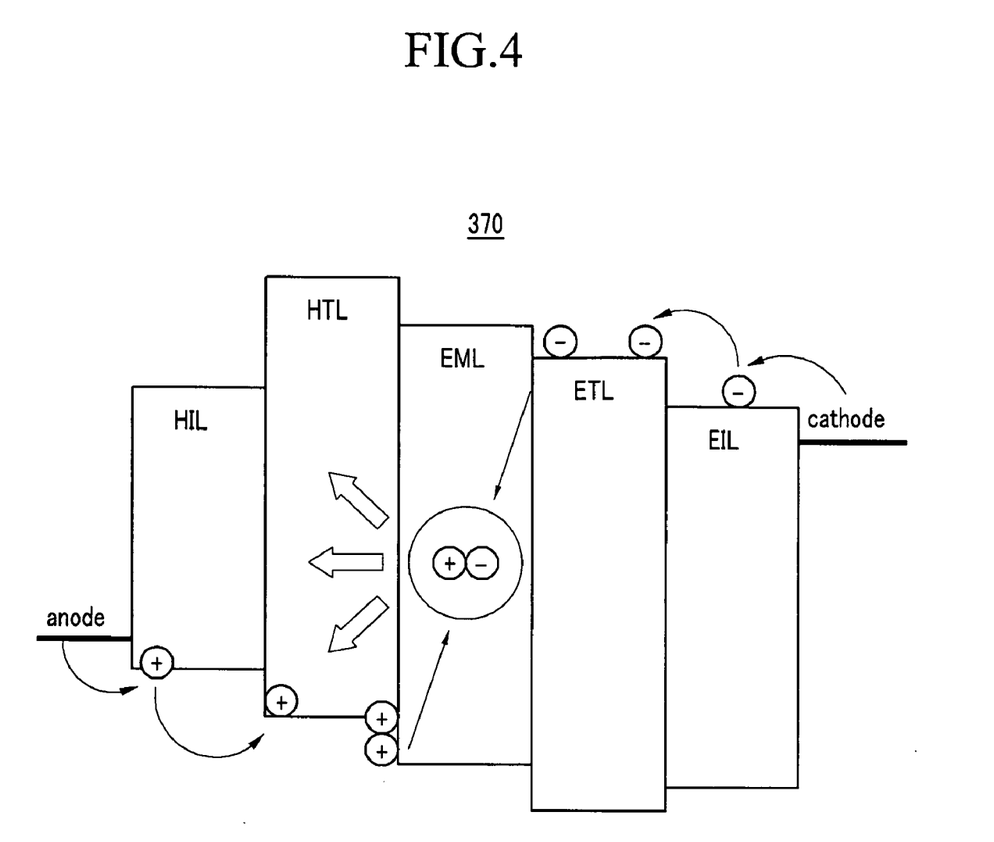
FIG. 4 is a schematic diagram of an exemplary OLED of an exemplary OLED display according to an exemplary embodiment of the present invention.

FIG. 3 is an exemplary sectional view of an exemplary OLED and an exemplary driving transistor of an exemplary pixel of an exemplary OLED display shown in FIG. 2, and FIG. 4 is a schematic diagram of an exemplary OLED of an exemplary OLED display according to an exemplary embodiment of the present invention.

A control electrode 124, such as a gate electrode, is formed on an insulating substrate 110. The control electrode 124 is preferably made of an aluminum Al-containing metal such as Al and an Al alloy, a silver Ag-containing metal such as Ag and a Ag alloy, a copper Cu-containing metal such as Cu and a Cu alloy, a molybdenum Mo-containing metal such as Mo and a Mo alloy, chromium Cr, titanium Ti, and tantalum Ta. However, the control electrode 124 may have a multi-layered structure including two conductive films (not shown) having different physical characteristics. In such a multi-layered structure, one of the conductive films is preferably made of a low resistivity metal such as an Al-containing metal, a Ag-containing metal, and a Cu-containing metal for reducing signal delay or voltage drop, and the other conductive film is preferably made of a material such as a Mo-containing metal, Cr, Ti, and Ta, which has good physical, chemical, and electrical contact characteristics with other materials such as indium tin oxide ("ITO") and indium zinc oxide ("IZO").

Examples of the combination of two films in a multi-layered structure include a pair of a lower Cr film and an upper Al (alloy) film and a pair of a lower Al (alloy) film and an upper Mo (alloy) film. While particular exemplary embodiments of the control electrode 124 have been described, the control electrode 124 may be made of many various metals or conductors. The lateral sides of the control electrode 124 are inclined relative to a surface of the substrate 110, and the preferable inclination angle thereof ranges from about 30° to about 80°.

An insulating layer 140 preferably made of, but not limited to, silicon nitride (SiNx) is formed on the control electrode 124.

A semiconductor 154 preferably made of, but not limited to, hydrogenated a-Si or polysilicon is formed on the insulating layer 140.

A pair of ohmic contacts 163 and 165 preferably made of silicide or n+ hydrogenated a-Si heavily doped with an n-type impurity are formed on the semiconductor 154.

The lateral sides of the semiconductor 154 and the ohmic contacts 163 and 165 are inclined relative to the surface of the substrate 110, and the preferable inclination angles thereof are in a range of about 30° to about 80°.

An input electrode 173, such as a source electrode, and an output electrode 175, such as a drain electrode, are formed on the ohmic contacts 163 and 165 and the insulating layer 140. The input electrode 173 and the output electrode 175 are preferably made of a refractory metal such as Cr, a Mo-containing metal, Ta, and Ti, and may have a multi-layered structure including a refractory metal film (not shown) and a low resistivity film (not shown) located thereon. Examples of the multi-layered structure include a double-layered structure including a lower Cr/Mo (alloy) film and an upper Al (alloy) film, and a triple-layered structure including a lower Mo (alloy) film, an intermediate Al (alloy) film, and an upper Mo (alloy) film. While particular exemplary embodiments of the input electrode 173 and the output electrode 175 have been described, the input electrode 173 and the output electrode 175 may be made of many various metals or conductors. Like the control electrode 124, the lateral sides of the input electrode 173 and the output electrode 175 are also inclined relative to a surface of the substrate 110, and the inclination angles thereof range from about 30° to about 80°.

The input electrode 173 and the output electrode 175 are separated from each other and disposed opposite each other with respect to the control electrode 124. The control electrode 124, the input electrode 173, and the output electrode 175, along with the semiconductor 154, form a driving transistor Qd having a channel formed in the semiconductor 154 between the input electrode 173 and the output electrode 175, and between the ohmic contacts 163 and 165.

The ohmic contacts 163 and 165 are interposed only between the underlying semiconductor 154 and the overlying input electrode 173 and the output electrode 175 thereon and reduce the contact resistance therebetween. The semiconductor 154 includes an exposed portion which is not covered with the input electrode 173 and the output electrode 175, thus forming the channel of the driving transistor Qd.

A passivation layer 180 is formed on the input electrode 173, the output electrode 175, the exposed portion of the semiconductor 154, and exposed portions of the insulating layer 140. The passivation layer 180 is preferably made of an inorganic insulator such as silicon nitride and silicon oxide, an organic insulator, or a low dielectric insulating material. The low dielectric material has a dielectric constant that is preferably lower than 4.0, and examples thereof are a-Si:C:O and a-Si:O:F formed by plasma enhanced chemical vapor deposition ("PECVD"). The passivation layer 180 may be made of an organic insulator having photosensitivity, and the surface of the passivation layer 180 may be flat. However, the passivation layer 180 may have a double-layered structure including a lower inorganic film and an upper organic film so that it may take the advantage of the organic film as well as protect the exposed portions of the semiconductor 154. The passivation layer 180 has a contact hole 185 exposing a portion of the output electrode 175.

A pixel electrode 190 is formed on the passivation layer 180. The pixel electrode 190 is physically and electrically connected to the output electrode 175 through the contact hole 185, and it is preferably made of a transparent conductor such as, but not limited to, ITO or IZO, or a reflective metal such as Al or a Ag alloy.

A partition 361, such as a bank layer, is formed on the passivation layer 180. The partition 361 encloses the pixel electrode 190 to define an opening on the pixel electrode 190 like a bank, and it is preferably made of an organic or inorganic insulating material.

An organic light emitting member 370 is formed on the pixel electrode 190, and it is confined within the opening enclosed by the partition 361.

The organic light emitting member 370, as shown in FIG. 4, has a multi-layered structure including an emitting layer EML and auxiliary layers for improving the efficiency of light emission of the emitting layer EML. The auxiliary layers include an electron transport layer ETL and a hole transport layer HTL flanking opposing sides of the emitting layer EML for improving the balance of electrons and holes, and an electron injecting layer EIL and a hole injecting layer HIL disposed adjacent the electron transport layer ETL and the hole transport layer HTL, respectively, for improving the injection of electrons and holes. In an alternative embodiment, the auxiliary layers may be omitted.

A common electrode 270 that is supplied with a common voltage Vss is formed on the organic light emitting member 370 and the partition 361. The common electrode 270 is preferably made of a reflective metal such as, but not limited to, Ca, Ba, Al, and Ag, or a transparent conductive material such as, but not limited to, ITO and IZO.

A combination of opaque pixel electrodes 190 and a transparent common electrode 270 is employed in a top emission type of OLED display that emits light toward the top of the display panel 300, and a combination of transparent pixel electrodes 190 and an opaque common electrode 270 is employed in a bottom emission type of OLED display that emits light toward the bottom of the display panel 300.

A pixel electrode 190, an organic light emitting member 370, and a common electrode 270 form an OLED LD illustrated in FIG. 2 having the pixel electrode 190 as an anode and the common electrode 270 as a cathode, or vice versa. The OLED LD uniquely emits light of one color among the main colors depending on the material of the light emitting member 370. An example of a set of the colors includes the three colors of red, green, and blue, and desired colors are displayed by a spatial sum of the three colors.

Referring to FIG. 1 again, the scanning driver 400 is connected to the scanning lines $G_1$-$G_n$ and synthesizes a high voltage Von for turning on the switching transistors Qs and a low voltage Voff for turning off the switching transistors Qs to generate scanning signals, which are applied to the scanning lines $G_1$-$G_n$.

The data driver 500 is connected to the data lines $D_1$-$D_m$ and applies data voltages to the data lines $D_1$-$D_m$.

The signal controller 600 controls the operation of the scanning driver 400 and the data driver 500, and compensates the input image data R, G, and B.

The scanning driver 400 or the data driver 500 may be implemented as at least one drive integrated circuit ("IC") chip directly mounted on the display panel 300, or they may be mounted on a flexible printed circuit film (not shown) in a tape carrier package ("TCP") type which is attached to the display panel 300. Alternately, the scanning driver 400 or the data driver 500 may be integrated with the display panel 300. Also, they may be integrated into one chip.

The signal controller 600 is supplied with input image data R, G, and B and input control signals controlling the display thereof, such as a vertical synchronization signal Vsync, a horizontal synchronization signal Hsync, a main clock signal MCLK, and a data enable signal DE, from an external graphics controller (not shown). After compensating the input image data R, G, and B on the basis of the input image data R, G, and B and the input control signals to generate output image data DAT and generating scanning control signals CONT1 and data control signals CONT2, the signal controller 600 transmits the scanning control signals CONT1 to the scanning driver 400, and the data control signals CONT2 and the output image data DAT to the data driver 500.

The scanning control signals CONT1 include a scanning start signal STV for instructing to start scanning a high voltage and at least one clock signal for controlling the output of the high voltage Von.

The data control signals CONT2 include a horizontal synchronization start signal STH for informing of start of data transmission for a row of pixels PX, a load signal LOAD for instructing to apply the data voltages to the data lines $D_1$-$D_m$, and a data clock signal HCLK.

In response to the data control signals CONT2 from the signal controller 600, the data driver 500 sequentially receives the image data DAT for a row of pixels, converts each image data DAT into a data voltage, and applies the data voltage to the corresponding data lines $D_1$-$D_m$.

The scanning driver 400 applies the scanning signals to the scanning lines $G_1$-$G_n$ in response to the scanning control signals CONT1 from the signal controller 600, thereby turning on the switching transistors Qs connected the scanning lines $G_1$-$G_n$, and accordingly the data voltages applied to the data lines $D_1$-$D_m$ are supplied to the control terminals of the driving transistors Qd through the turned-on switching transistors Qs.

The data voltages supplied to the driving transistors Qd are stored in the capacitors Cst and preserved even after the switching transistors Qs are turned off. Each of the driving transistors Qd supplied with the data voltages is turned on and outputs current $I_{LD}$ having a magnitude depending on the data voltages. Then, this current $I_{LD}$ flows into the OLED LD from the output terminal of the driving transistor Qd, and the respective pixels PX display images.

After one horizontal period (or "1H" which is equal to one period of a horizontal synchronization signal Hsync and a data enable signal DE), the data driver 500 and the scanning driver 400 repeat the same operation for the next row of pixels PX. In this way, all scanning lines $G_1$-$G_n$ are sequentially supplied with the scanning signals during a frame, thereby applying the data voltages to all pixels PX. The next frame starts after one frame is finished, and the same operation is repeated in the next frame.

Now, various examples of an OLED display according to exemplary embodiments of the present invention will be described with reference to FIG. 5 to FIG. 8.

Figure 5:
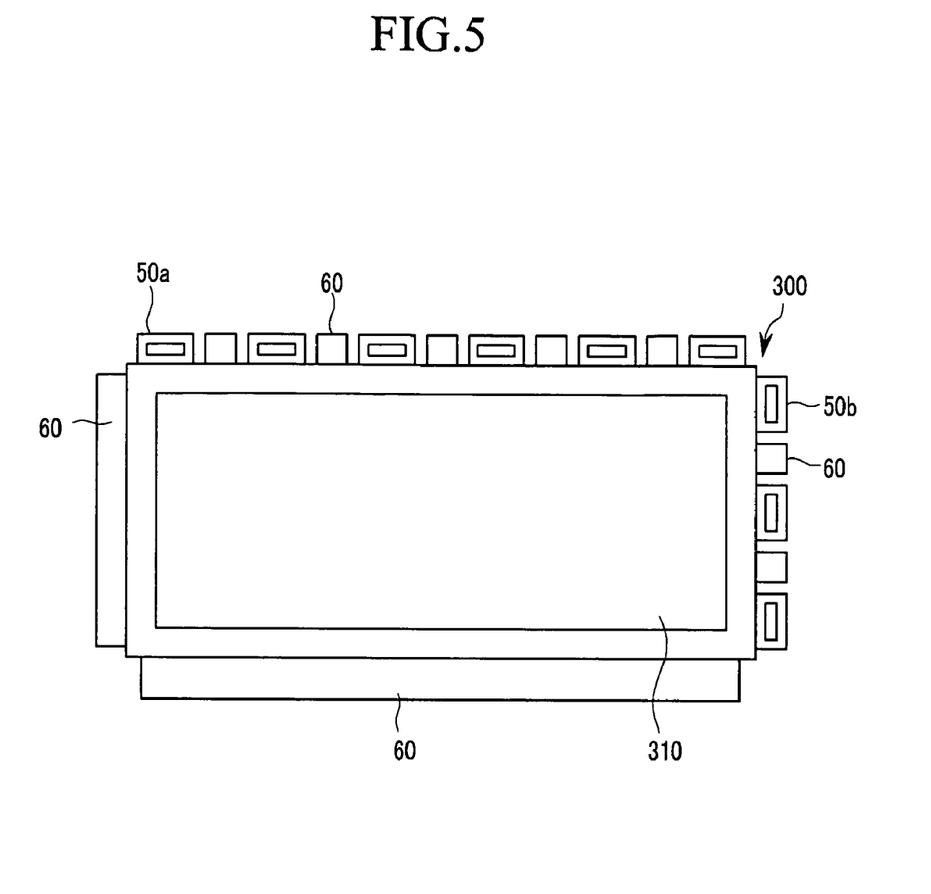
FIG. 5 is a plan view of an exemplary OLED display according to an exemplary embodiment of the present invention.
Figure 6:
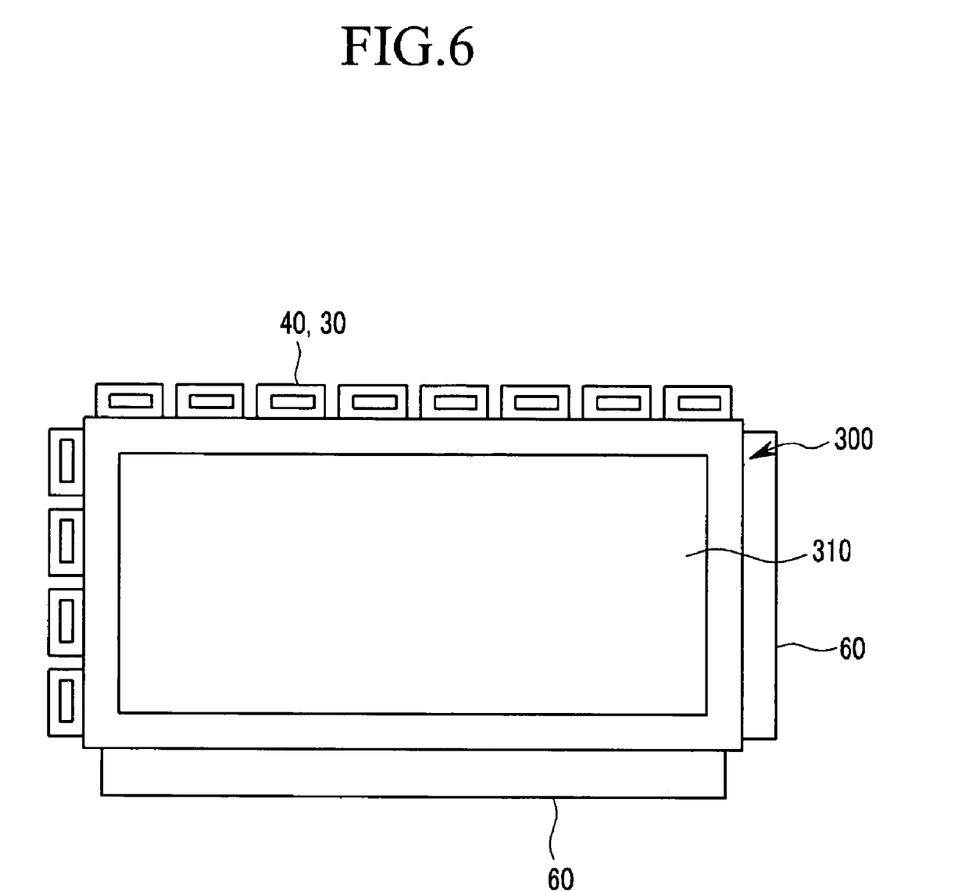
FIG. 6 is a plan view of an exemplary OLED display according to another exemplary embodiment of the present invention.

FIG. 5 is a plan view of an exemplary OLED display according to an exemplary embodiment of the present invention, and FIG. 6 is a plan view of an exemplary OLED display according to another exemplary embodiment of the present invention.

Referring to FIG. 5 and FIG. 6, an OLED display includes an OLED display panel 300, drive circuit packages 50a, 50b, 30, and 40, and flexible printed circuit ("FPC") films 60 that are attached to the OLED display panel 300.

The OLED display panel 300 includes a display region 310 provided with a plurality of pixels and substantially displays images. The edge area (peripheral region) outside of the display region 310 in the OLED display panel 300 is for attachment of various members for driving the OLED display panel 300.

In the OLED display illustrated in FIG. 5, the drive circuit packages 50a and 50b include a plurality of data drive circuit packages 50a attached to an upper edge (or lower edge) of the OLED display panel 300 and a plurality of scanning drive circuit packages 50b attached to a right edge (or a left edge) of the OLED display panel 300. Each of the data drive circuit packages 50a and the scanning drive circuit packages 50b includes an FPC film and a drive circuit chip mounted thereon that may be a tape carrier package ("TCP") type or a chip on film ("COF") type. However, not being limited to the above, the circuits may be mounted directly on the display panel 300 or integrated with the display panel 300.

The FPC films 60 are attached between the data drive circuit packages 50a and the scanning drive circuit packages 50b, and they are also attached to the remaining edges of the OLED display panel 300, such as a lower edge and a left edge of the OLED display panel 300.

The drive circuit packages 50a and 50b and the FPC films 60 are also attached to a printed circuit board ("PCB", not shown), the drive circuit packages 50a and 50b are supplied with image data and various control signals from the PCB and then apply data voltages and so forth to the display panel 300, and the FPC films 60 transmit a drive voltage Vdd or a common voltage Vss supplied from the PCB to the display panel 300. The drive voltage Vdd is transmitted substantially upward and downward in the display panel 300, and the common voltage Vss may be transmitted upward and downward, or from side to side in the display panel 300.

In FIG. 5, the data drive circuit packages 50a or the scanning drive circuit packages 50b, along with the FPC films 60 are not limited to the illustrated embodiments, and may be attached to other edges of the display panel 300.

In the OLED display illustrated in FIG. 6, drive packages 30 and 40 are attached to the upper and the left edges of the OLED display panel 300, separately. Alternatively, the drive packages 30 and 40 may be attached to the upper and right edges of the OLED display panel 300, the lower and left edges of the OLED display panel 300, or the lower and right edges of the OLED display panel 300.

That is, in the illustrated embodiment, only the drive packages 30 and 40 are attached to the upper and the left edges of the OLED display panel 300. The drive packages 30 and 40 apply data voltages or scanning voltages as well as transmit a common voltage Vss and/or a drive voltage Vdd to the display panel 300. The drive packages 30 and 40 attached to the upper edge of the OLED display panel 300 mainly include data drive voltage circuits, and the drive packages 30 and 40 attached to the left edge of the OLED display panel 300 mainly include scanning drive voltage circuits.

The FPC films 60 are attached to the remaining edges of the OLED display panel 300, such as, in the illustrated embodiment, the lower edge and the right edge of the OLED display panel 300. However, not being limited to the above, the drive packages 30 and 40 may be attached to the four edges of the OLED display panel 300 as necessary.

Now, drive packages 30 and 40 according to various embodiments of the present invention will be further described with reference to FIG. 7 to FIG. 9.

Figure 7:
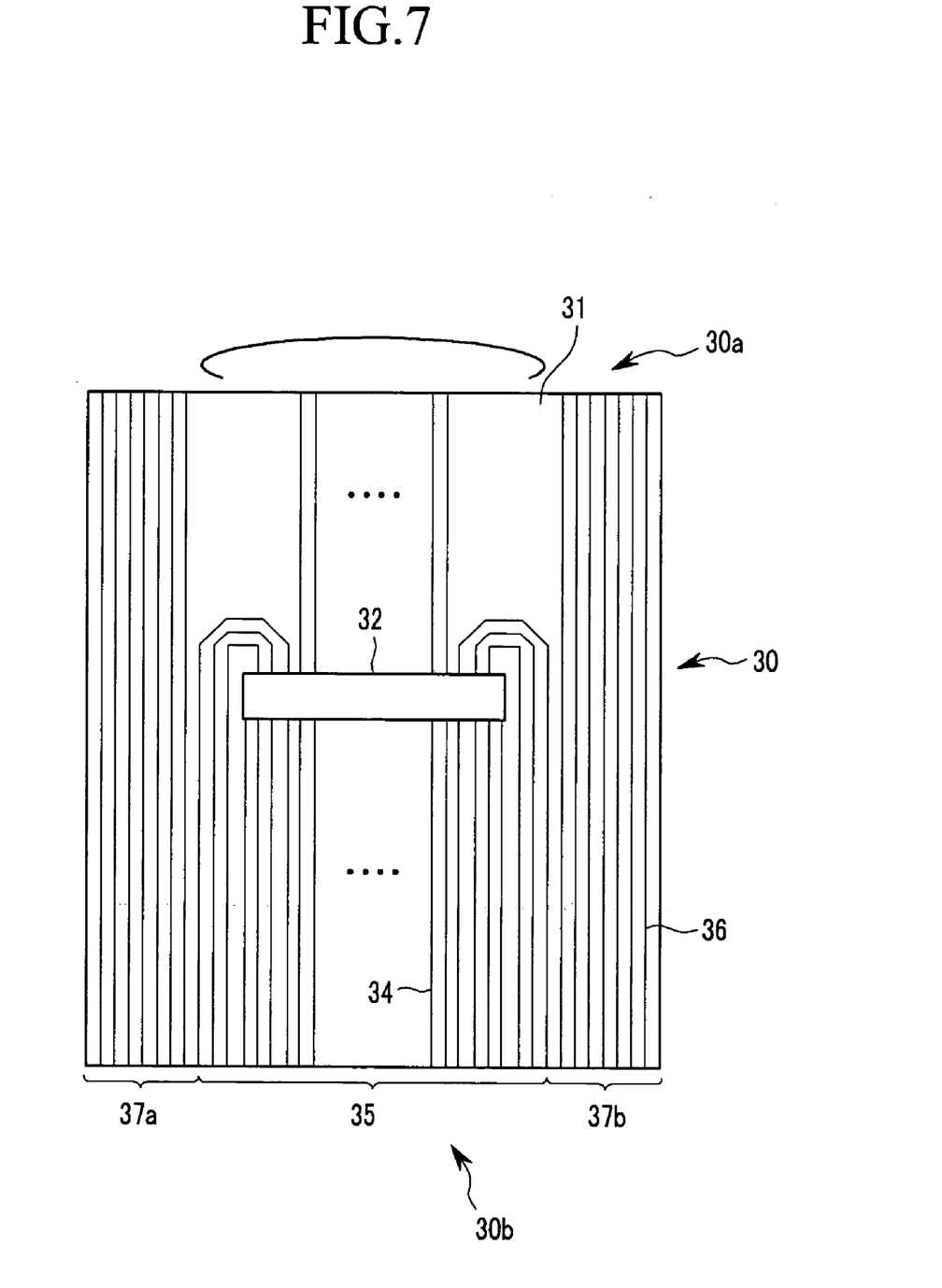
FIG. 7 is a plan view of an exemplary drive package according to an exemplary embodiment of the present invention.
Figure 8:
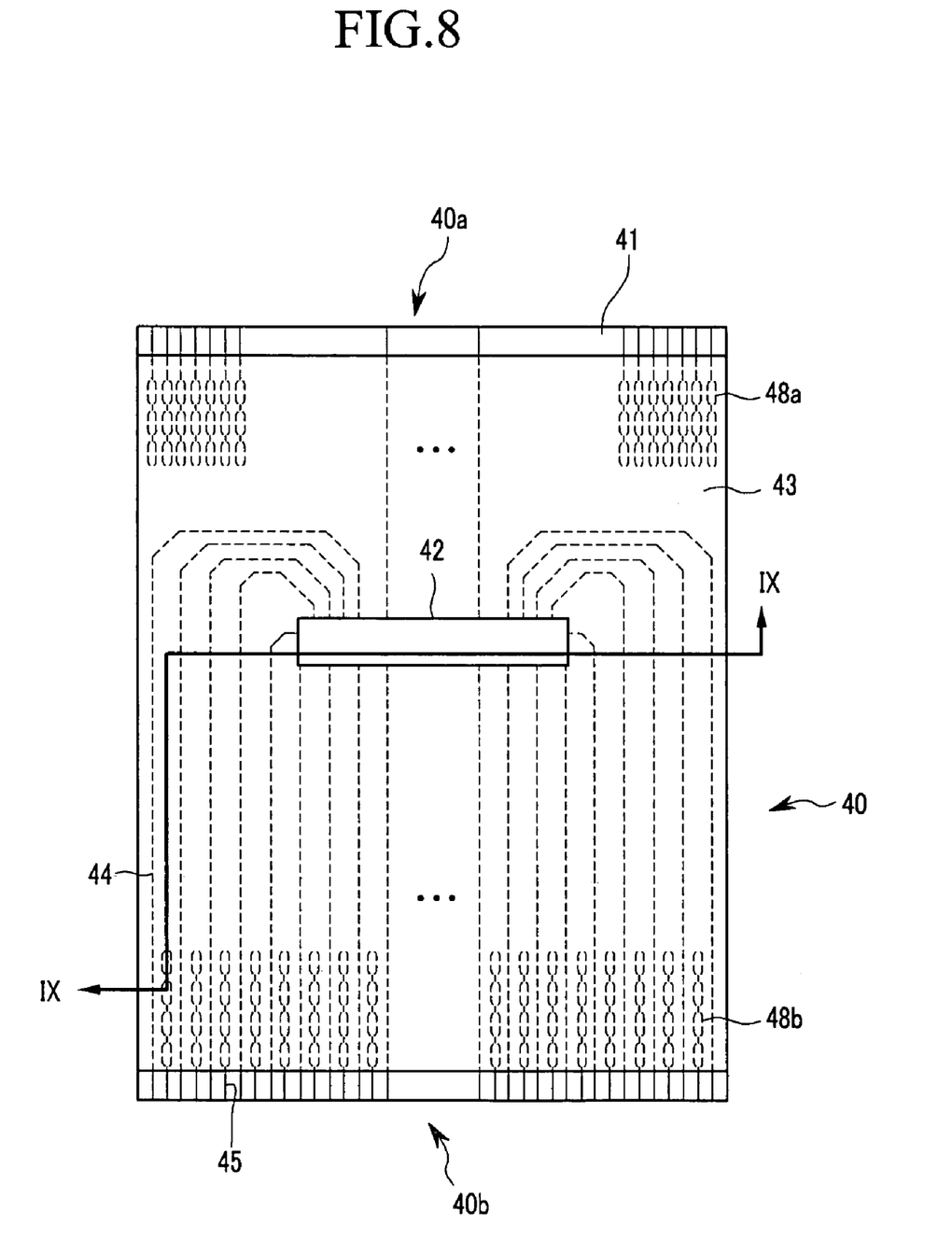
FIG. 8 is a plan view of an exemplary drive package according to another exemplary embodiment of the present invention; and, FIG. 9 is a sectional view of the exemplary drive package shown in FIG. 8 taken along line IX-IX.
Figure 9:
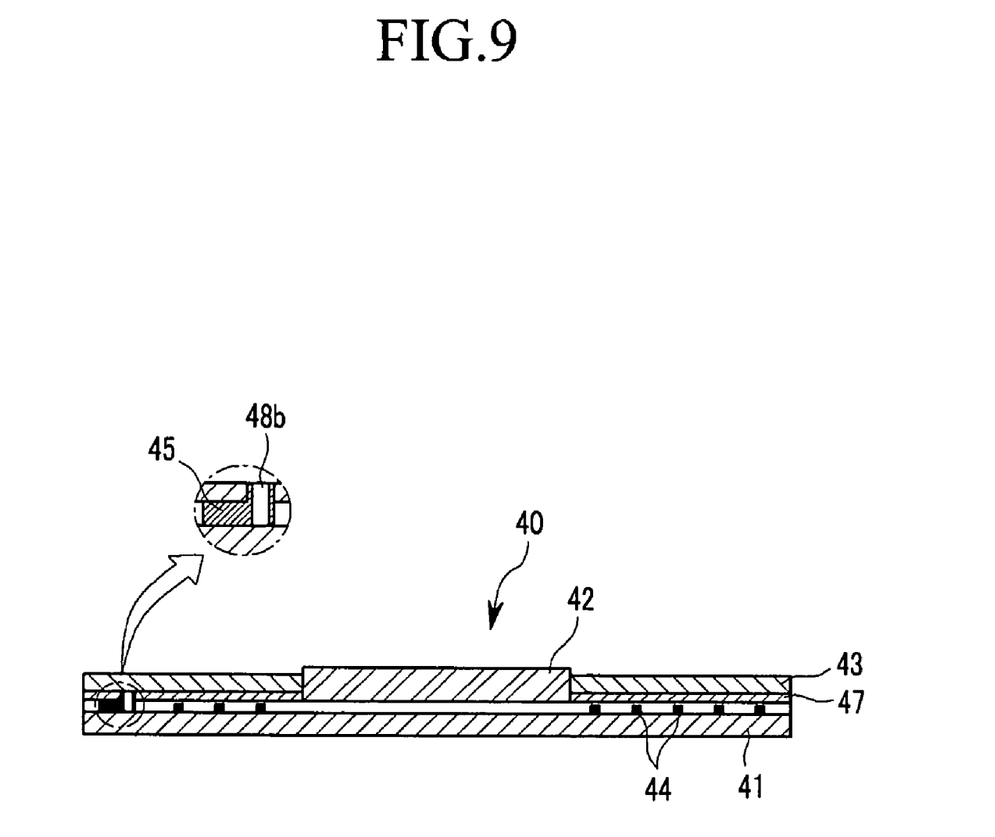

FIG. 7 and FIG. 8 are plan views of the exemplary drive packages shown in FIG. 6, and FIG. 9 is a sectional view of the exemplary drive package shown in FIG. 8 taken along line IX-IX.

Referring to FIG. 7, a drive package 30 includes a base film 31, a plurality of signal lines 34 and 36 formed on the base film 31, and a drive circuit chip 32 mounted on the base film 31.

The base film 31 is a supporting body of the drive package 30, and has an input terminal 30a and an output terminal 30b. The input terminal 30a is located at a first edge of the drive package 30, and the output terminal 30b is located at a second edge, opposite the first edge, of the drive package 30. The input terminal 30a is connected to the PCB, and the output terminal 30b is connected to the OLED display panel 300. The base film 31 has insulating properties and flexibility, and it may be made of a material such as, but not limited to, polyimide.

The drive circuit chip 32 is mounted on a central part of the base film 31. The drive circuit chip 32 is an IC chip that applies data voltages or scanning voltages to the OLED display panel 300.

The signal lines 34 and 36 may be formed on the base film 31 or thereunder.

The signal lines 34 and 36 include changing signal lines 34 for transmitting changing signals that have varying values such as data signals or scanning signals, and fixed signal lines 36 for transmitting fixed signals that have fixed values such as the common voltage Vss or the drive voltage Vdd.

The changing signal lines 34 are formed on the central area with the chip 32 centered thereon, that is, on the changing signal region 35 of the base film 31, and they extend from the input terminal 30a to the drive circuit chip 32 and then extend again from the drive circuit chip 32 to the output terminal 30b. In other words, the changing signal lines 34 extend from the first edge to the second edge of the drive package 30, with a connection to the drive circuit chip 32 between the first and second edges. The fixed signal lines 36 are formed adjacent third and fourth edge areas, that is, on fixed signal regions 37a and 37b, and they extend continuously from the input terminal 30a to the output terminal 30b. In other words, the fixed signal lines 36 extend continuously from the first edge to the second edge and are located in the fixed signal regions 37a and 37b. The changing signal lines 34 are located in the changing signal region 35 which is disposed between the fixed signal region 37a and the fixed signal region 37b. The fixed signal region 37a is located adjacent a third edge of the drive package 30, and the fixed signal region 37b is located adjacent a fourth edge, opposite the third edge, of the drive package 30. The base film 31 may be substantially rectangular shaped, with the first and second edges substantially parallel to each other, and the third and fourth edges substantially parallel to each other.

Referring to FIG. 8 and FIG. 9, a drive package 40 according to another exemplary embodiment of the present invention includes a base film 41, a drive circuit chip 42 mounted on the base film 41, a conductive layer 43 covering the base film 41, signal lines 44 and 45 formed on the base film 41, and an insulating film 47 interposed between the conductive layer 43 and the signal lines 44 and 45.

The base film 41 and the drive circuit chip 42 are substantially the same as the base film 31 and the drive circuit chip 32 of the drive package 30 in FIG. 7.

The signal lines 44 and 45 include changing signal lines 44 and fixed signal lines 45. The changing signal lines 44, as in the drive package 30 in FIG. 7, include changing signal lines 44 that extend from the input terminal 40a, located at a first edge of the drive package 40, to the drive circuit chip 42 in a central area of the drive package 40, and changing signal lines 44 that extend from the drive circuit chip 42 to the output terminal 40b, located at a second edge of the drive package 40, opposite the first edge. The changing signal lines 44 need not be limited to a central region of the base film 41, but may exit the drive circuit chip 42 so as to be evenly distributed from a third edge to a fourth edge of the base film 41 at the second edge of the drive package 40.

The fixed signal lines 45 exist only near the input terminal 40a and the output terminal 40b of the base film 41. In other words, the fixed signal lines 45 do not extend continually from the first edge to the second edge of the drive package 40. Instead, the fixed signal lines 45 extend partially across the base film 41 from the first edge of the drive package 40, and partially across the base film 41 from the second edge of the drive package 40. A central region of the base film 41, such as an area surrounding the drive circuit chip 42, may thus be devoid of the fixed signal lines 45. Thus, the fixed signal lines 45 include a first set of fixed signal lines 45 extending from the input terminal 40a, and a second set of fixed signal lines 45 extending from the output terminal 40b, where the first and second sets of fixed signal lines 45 are physically separated from each other.

The fixed signal lines 45 are disposed between the changing signal lines 44 in turn near the output terminal 40b. That is, adjacent the second edge of the drive package 40, the fixed signal lines 45, such as those within the second set of fixed signal lines 45, are alternatingly arranged with the changing signal lines 44.

The insulating film 47 covers substantially the entire surface of the base film 41, and the conductive layer 43 covers substantially the entire surface of the insulating film 47. The insulating film 47 and the conductive layer 43 expose portions of the base film 41 and the signal lines 44 and 45 near the input terminal 40a and the output terminal 40b of the base film 41. The end portions of the signal lines 44 and 45 at the exposed input terminal 40a are used for pads to connect the drive package 40 to the PCB, and the end portions of the signal lines 44 and 45 at the exposed output terminal 40b are used for pads to connect the drive package 40 to the display panel 300. The insulating film 47 and the conductive layer 43 may further include aligned openings for receiving the drive circuit chip 42 therein. The drive circuit chip 42 may protrude over the conductive layer 43 as shown in FIG. 9.

A plurality of connecting members 48a and 48b that electrically connect the fixed signal lines 45 and the conductive layer 43 are formed near the input terminal 40a and the output terminal 40b. The connecting members 48a and 48b may be penetrating holes that penetrate from the fixed signal lines 45 to the conductive layer 43 through the insulating film 47. As illustrated, each fixed signal line 45 may be associated with several connecting members 48a and several connecting members 48b. Each of the connecting members 48a and 48b may include a conductive portion such that the conductive layer 43 is electrically connected to each of the fixed signal lines 45.

In such a drive circuit package 40, fixed signals applied to the fixed signal lines 45, the first set of fixed signal lines 45, at the input terminal 40a of the base film 41 are transmitted to the conductive layer 43 via the connecting members 48a near the input terminal 40a. The fixed signals transmitted to the conductive layer 43 are then transmitted towards the output terminal 40b along the conductive layer 43 and are transmitted to the fixed signal lines 45, the second set of fixed signal lines 45, formed at the output terminal 40b of the base film 41 via the connecting members 48b near the output terminal 40b. Here, since the fixed signal lines 45 are uniformly disposed between the changing signal lines 44 at the output terminal 40b, such as by being alternatingly arranged between changing signal lines 44, fixed signals such as a drive voltage Vdd or a common voltage Vss can be applied uniformly to the entire display panel 300. Therefore, the uniformity of display of the OLED display can be improved.

As described above, according to exemplary embodiments of the present invention, much more current can be stably supplied to the OLED display so that uniformity of display can be improved.

Although exemplary embodiments of the present invention have been described hereinabove, it should be clearly understood that many variations and/or modifications of the basic inventive concepts herein taught which may appear to those skilled in the present art will still fall within the spirit and scope of the present invention, as defined in the appended claims.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A drive film for an organic light emitting diode display, the drive film comprising:
   a base film including an input terminal and an output terminal;
   a plurality of first signal lines formed on the base film; and
   a plurality of second signal lines formed on the base film and disposed between the first signal lines at the output terminal.

2. The drive film of claim 1, wherein the second signal lines are alternatingly disposed between the first signal lines, respectively, at the output terminal.

3. The drive film of claim 1, wherein a first set of the second signal lines at the input terminal are electrically connected to a second set of the second signal lines at the output terminal via a conductive layer disposed over the base film and the first and second signal lines.

4. The drive film of claim 1, wherein the second signal lines are evenly distributed across the output terminal.

5. The drive film of claim 1, further comprising:
   an insulating film formed on the first signal lines and the second signal lines and exposing portions of the first and second signal lines at the input terminal and the output terminal of the base film;
   a conductive layer formed on the insulating film; and
   a plurality of connecting members connecting the second signal lines and the conductive layer near the input terminal and the output terminal.

6. The drive film of claim 5, wherein the connecting members comprise penetrating holes passing through the insulating film.

7. The drive film of claim 6, wherein each connecting member comprises a conductive portion.

8. The drive film of claim 1, wherein the base film comprises polyimide.

9. The drive film of claim 1, wherein the first signal lines transmit signals having varying values.

10. The drive film of claim 1, wherein the second signal lines transmit signals having fixed values.

11. A drive package for an organic light emitting diode display, the drive package comprising:
   a base film including an input terminal and an output terminal;
   a conductive layer formed on the base film and exposing portions of the input terminal and the output terminal of the base film;
   a drive circuit chip mounted on the base film and exposed over the conductive layer;
   a plurality of first signal lines formed on the base film and connected to the drive circuit chip;
   a plurality of second signal lines formed near the input terminal and a plurality of second signal lines formed near the output terminal of the base film, the plurality of second signal lines formed near the output terminal disposed between the first signal lines at the output terminal;
   an insulating film interposed between the first and second signal lines and the conductive layer; and
   a plurality of connecting members connecting the second signal lines and the conductive layer near the input terminal and the output terminal.

12. The drive package of claim 11, wherein the connecting members comprise penetrating holes passing through the insulating film.

13. The drive package of claim 11, wherein the base film comprises polyimide.

14. The drive package of claim 11, wherein the first signal lines transmit data voltages.

15. The drive package of claim 11, wherein the first signal lines transmit scanning voltages.

16. The drive package of claim 11, wherein the second signal lines transmit a drive voltage.

17. The drive package of claim 11, wherein the second signal lines transmit a common voltage.

18. The drive package of claim 11, wherein the drive circuit chip comprises a data drive integrated circuit chip.

19. The drive package of claim 11, wherein the drive circuit chip comprises a scanning drive integrated circuit chip.

20. The drive package of claim 11, wherein the second signal lines are evenly distributed across the output terminal.

21. An organic light emitting diode display comprising
   a substrate,
   a display region formed on the substrate, and
   a first drive package successively attached to at least one of upper and lower edges of the substrate,
   wherein the first drive package comprises:
   a first base film including an input terminal and an output terminal;
   a first conductive layer formed on the first base film and exposing portions of the input terminal and the output terminal of the first base film;
   a first drive circuit chip mounted on the first base film and exposed over the first conductive layer;
   a plurality of first signal lines formed on the first base film and connected to the first drive circuit chip;
   a plurality of second signal lines formed near the input terminal and a plurality of second signal lines formed near the output terminal of the first base film, and the plurality of second signal lines formed near the output terminal disposed between the first signal lines at the output terminal;

a first insulating film interposed between the first and the second signal lines and the first conductive layer; and a plurality of first connecting members connecting the second signal lines and the first conductive layer near the input terminal and the output terminal.

22. The organic light emitting diode display of claim 21, wherein the first signal lines transmit data voltages, and the first drive circuit chip comprises a data drive integrated circuit chip.

23. The organic light emitting diode display of claim 21, wherein the second signal lines transmit a common voltage or a drive voltage.

24. The organic light emitting diode display of claim 21, further comprising a second drive package attached to at least one of left and right edges of the substrate, wherein the second drive package comprises:

a second base film including an input terminal and an output terminal;

a second conductive layer formed on the second base film and exposing portions of the input terminal and the output terminal of the second base film;

a second drive circuit chip mounted on the second base film and exposed over the second conductive layer;

a plurality of third signal lines formed on the second base film and connected to the second drive circuit chip;

a plurality of fourth signal lines formed near the input terminal and a plurality of fourth signal lines formed near the output terminal of the second base film, and the plurality of fourth signal lines formed near the output terminal disposed between the third signal lines at the output terminal;

a second insulating film interposed between the third and fourth signal lines and the second conductive layer; and a plurality of second connecting members connecting the fourth signal lines and the second conductive layer near the input terminal and the output terminal.

25. The organic light emitting diode display of claim 24, wherein the fourth signal lines transmit a common voltage or a drive voltage.

26. The organic light emitting diode display of claim 24, wherein the third signal lines transmit scanning voltages, and the second drive circuit chip comprises a scanning drive integrated circuit chip.

27. A method of enhancing uniformity of a display of an organic light emitting diode display, the method comprising:

providing a drive package having an input terminal on a first edge, an output terminal on a second edge opposite the first edge, and having third and fourth opposing edges connected between the first and second edges;

attaching the output terminal of the drive package to a display panel of the organic light emitting diode display; and, substantially evenly delivering a fixed voltage from the output terminal of the drive package along a length of the output terminal extending from the third edge to the fourth edge of the drive package.

28. The method of claim 27, wherein providing a drive package includes:

arranging a plurality of first signal lines on a base film of the drive package;

arranging a first set of second signal lines adjacent the input terminal, and a second set of second signal lines adjacent the output terminal;

and uniformly distributing the second set of signal lines from the third edge to the fourth edge of the drive package, wherein the fixed voltage is delivered from the second set of signal lines to the display panel.

29. The method of claim 28, wherein arranging the plurality of first signal lines comprises alternatingly arranging the first signal lines with the second set of second signal lines adjacent the output terminal.

30. The method of claim 27, further comprising substantially evenly delivering a variable voltage from the output terminal of the drive package along a length of the output terminal extending from the third edge to the fourth edge of the drive package.

31. The method of claim 30, wherein substantially evenly delivering the fixed voltage and the variable voltage from the output terminal includes alternatingly arranging signal lines delivering the fixed voltage with signal lines delivering the variable voltage.

* * * * *